(12) United States Patent
Wan et al.

(10) Patent No.: US 11,990,345 B2
(45) Date of Patent: May 21, 2024

(54) PATTERNING METHOD AND SEMICONDUCTOR STRUCTURE

(71) Applicant: CHANGXIN MEMORY TECHNOLOGIES, INC., Hefei (CN)

(72) Inventors: Qiang Wan, Hefei (CN); Jun Xia, Hefei (CN); Kangshu Zhan, Hefei (CN); Sen Li, Hefei (CN); Tao Liu, Hefei (CN); Penghui Xu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 387 days.

(21) Appl. No.: 17/647,994

(22) Filed: Jan. 14, 2022

(65) Prior Publication Data

US 2022/0319857 A1    Oct. 6, 2022

Related U.S. Application Data

(63) Continuation of application No. PCT/CN2021/112608, filed on Aug. 13, 2021.

(30) Foreign Application Priority Data

Mar. 30, 2021   (CN) .......................... 202110338758.6

(51) Int. Cl.
  *H01L 21/308* (2006.01)
  *H01L 21/033* (2006.01)
(52) U.S. Cl.
  CPC ...... *H01L 21/3086* (2013.01); *H01L 21/0337* (2013.01)
(58) Field of Classification Search
  CPC .................................................. H01L 21/3086
  See application file for complete search history.

(56) References Cited

U.S. PATENT DOCUMENTS 9,559,147 B2    1/2017  Eun
10,395,976 B1   8/2019  Shih et al.
(Continued)

FOREIGN PATENT DOCUMENTS

CN    1177208 A     3/1998
CN  106252507 A    12/2016
(Continued)

OTHER PUBLICATIONS

International Search Report in PCT/CN2021/112608 mailed Jan. 4, 2022, 10 pages.

*Primary Examiner* — Walter H Swanson
(74) *Attorney, Agent, or Firm* — Cooper Legal Group, LLC

(57) ABSTRACT

Embodiments of the present disclosure provide a patterning method and a semiconductor structure. The method includes: providing a substrate, wherein the substrate includes adjacent storage regions and peripheral circuit regions; forming, on the substrate, a pattern transfer layer, the pattern transfer layer having a plurality of first hard masks, wherein the first hard masks extend along a first direction and are spaced apart from each other; forming a barrier layer on the pattern transfer layer; forming, on the barrier layer, a plurality of second hard masks, the plurality of second hard masks extending along a second direction, wherein the second hard masks are spaced apart from each other, and the second hard masks are located in the storage regions and second hard masks close to the peripheral circuit regions have structural defects.

15 Claims, 14 Drawing Sheets

(56) References Cited

U.S. PATENT DOCUMENTS 10,553,433 B2    2/2020   Shih
2022/0102142 A1*   3/2022   Lung ................. H01L 21/32139

FOREIGN PATENT DOCUMENTS

| CN | 108597992 A | 9/2018 |
|----|-------------|--------|
| CN | 109767977 A | 5/2019 |
| CN | 113097142 A | 7/2021 |

* cited by examiner

PATTERNING METHOD AND SEMICONDUCTOR STRUCTURE

CROSS-REFERENCE TO RELATED APPLICATIONS

This is a continuation of International Application No. PCT/CN2021/112608, filed on Aug. 13, 2021, which claims the priority to Chinese Patent Application No. 202110338758.6, titled "PATTERNING METHOD AND SEMICONDUCTOR STRUCTURE" and filed on Mar. 30, 2021. The entire contents of International Application No. PCT/CN2021/112608 and Chinese Patent Application No. 202110338758.6 are incorporated herein by reference.

TECHNICAL FIELD

The present disclosure relates to the technical field of semiconductors, and specifically, to a patterning method and a semiconductor structure.

BACKGROUND

A dynamic random access memory (DRAM) includes a storage region (array area) constituted by a plurality of memory cells, and a peripheral circuit region (peripheral area) in which a control circuit is located. As a size of a semiconductor device continues to decrease, a self-aligned-doubled patterning (SADP) process has been proposed to improve integration of the device.

In an SADP method in the prior art, due to structural differences between a storage region and a peripheral circuit region, different etching load effects are generated during the patterning process, resulting in misalignment of key dimensions after patterning, and further causing structural defects in a part of the storage region close to the peripheral circuit region. Therefore, how to improve accuracy of process pattern forming is a problem that urgently needs to be resolved at present.

SUMMARY

A semiconductor structure of the embodiments of the present disclosure is manufactured by using the foregoing patterning method.

The patterning method of the embodiments of the present disclosure includes:
providing a substrate, wherein the substrate includes adjacent storage regions and peripheral circuit regions;
forming, on the substrate, a pattern transfer layer, the pattern transfer layer having a plurality of first hard masks, wherein the first hard masks extend along a first direction and are spaced apart from each other; and forming a barrier layer on the pattern transfer layer;
forming, on the barrier layer, a plurality of second hard masks, the plurality of second hard masks extending along a second direction, wherein the second hard masks are spaced apart from each other; and
the second hard masks are located in the storage regions and second hard masks close to the peripheral circuit regions have structural defects;
forming a first buffer layer on the barrier layer, and filling the second hard masks that have the structural defects with the first buffer layer, wherein orthographic projection of the first buffer layer overlaps the peripheral circuit regions and a part of each of the storage regions; and patterning the barrier layer and the pattern transfer layer by using the first buffer layer and second hard masks not filled with the first buffer layer as a mask.

BRIEF DESCRIPTION OF THE DRAWINGS

The above and other features and advantages of the present disclosure will become more apparent by describing exemplary implementations thereof in detail with reference to the accompanying drawings.

DETAILED DESCRIPTION

Figure 1:
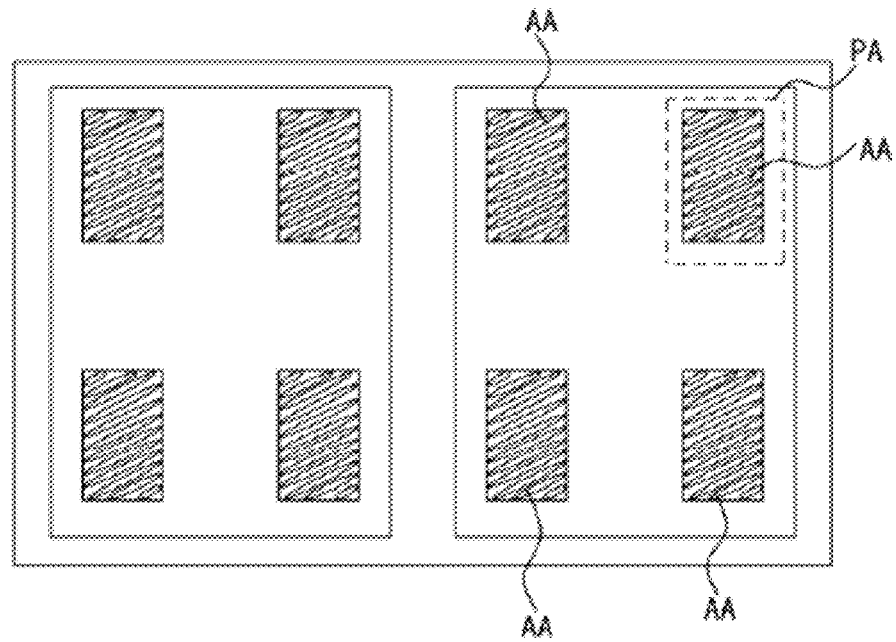
FIG. 1 is a top view of a semiconductor structure.

Exemplary embodiments will be described below in further detail with reference to the accompanying drawings. The exemplary implementations may be implemented in various forms, and may not be construed as being limited to those described herein. On the contrary, these exemplary implementations are provided to make the present disclosure comprehensive and complete and to fully convey the concept manifested therein to those skilled in the art. The same reference numerals in the figures indicate the same or similar structures, and thus their detailed descriptions will be omitted.

FIG. 1 is a top view of a semiconductor structure. FIG. 1 schematically shows two memory cells (BANK), and each memory cell includes a plurality of storage regions AA. Two, four, six, eight, ten, or another quantity of storage regions AA may be provided in each memory cell. Each peripheral circuit region PA is provided adjacent to a periphery of the storage region AA. The storage regions AA are regions in which memory arrays are subsequently manufactured. The peripheral circuit regions PA are regions in which peripheral circuits are subsequently manufactured.

It should be noted that, the storage regions AA and the peripheral circuit regions PA shown in FIG. 1 are only at possible layout locations, but are not limited thereto. In other layouts, the storage regions AA and the peripheral circuit regions PA may alternatively be arranged in other suitable manners.

It can be understood that, for ease of description, a patterning method of the embodiments of the present disclosure is described by using manufacturing of a memory as an example, but is not limited thereto.

FIG. 2A to FIG. 9B are each a schematic diagram of a different process stage of a patterning method according to the present disclosure, wherein a drawing A represents a top view, and a drawing B represents a cross-sectional view. In addition, FIG. 2B is a cross-sectional view along K-K in FIG. 2A. Other cross-sectional views are all cross-sectional views along K-K in corresponding drawings A. For clear illustration of patterns in the drawings A, the cross-sectional lines K-K are omitted in other drawings A.

First, a substrate is provided. In some implementations, the substrate may include a semiconductor material such as a silicon base or a silicon on insulator (SOI) base, and may have a single-layer or multi-layer structure.

In some embodiments, the substrate may include various layers, including conductive or insulating layers formed on a semiconductor substrate. The substrate may contain various doping settings, which may be determined according to design requirements known in the art. For example, different doping regions (such as n-wells or p-wells) may be formed in the substrate, which are designed for different apparatus types (such as n-type polysilicon substrates or p-type polysilicon substrates). A doping method may include ion implantation and/or diffusion processes. An isolation structure is further formed on the substrate. The isolation structure can isolate several active regions within the substrate. The substrate includes but is not limited to a single crystal silicon substrate, a polysilicon substrate, a gallium nitride substrate, or a sapphire substrate. In addition, the substrate may further include an epitaxial layer and/or may have another enhancement structure.

In some implementations, the substrate may also be formed with a component structure such as a word line, a bit line, a source/drain, a storage node contact plug, or a storage node contact pad material layer. In this regard, because a manufacturing process of a memory before a storage node contact pad is not the focus of the method and structure of the present disclosure, in order to avoid obscuring the focus of the present disclosure and excessive complexity of the accompanying drawings, the relevant manufacturing process thereof is not described herein in superfluous detail.

Figure 2A:
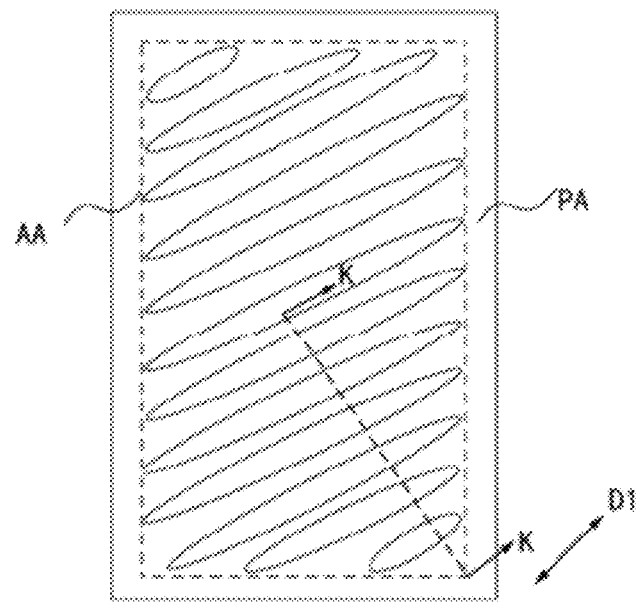
FIG. 2A to FIG. 9B are each a schematic diagram of a different process stage of a patterning method according to the present disclosure, wherein A represents a top view, and B represents a cross-sectional view.
Figure 2B:
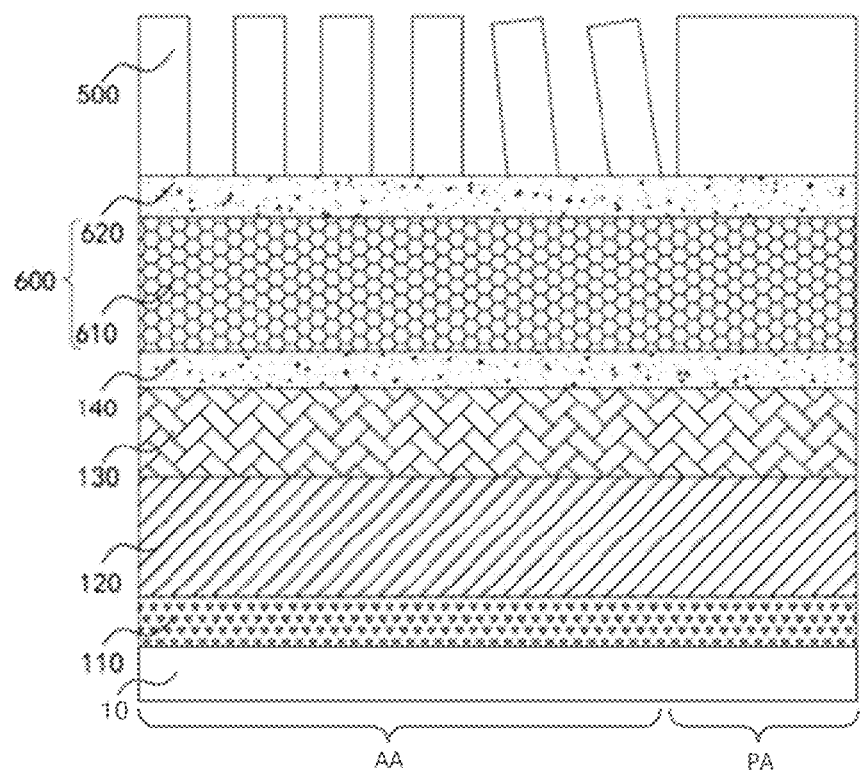

As shown in FIG. 2A and FIG. 2B, FIG. 2A shows a location circled by a dashed line box in FIG. 1. A first material layer 110, a second material layer 120, a third material layer 130, a fourth material layer 140, a second laminated structure 600, and a photoresist layer 500 are sequentially formed on the substrate 10 from bottom to top. The photoresist layer 500 has patterns of a plurality of strip-shaped structures extending along a first direction D1. The bottoms of the plurality of strip-shaped structures expose a top surface of a second mask layer 620.

The first material layer 110 may include polycrystalline silicon, and the second material layer 120 may include silicon oxide. The second material layer 120 may be used as a mask of the first material layer 110. An etching selection ratio of silicon oxide to polycrystalline silicon is relatively high, and polycrystalline silicon is harder and has better structural stability. Therefore, use of a polycrystalline silicon material as a mask for a patterning process can ensure integrity of a semiconductor structure. The semiconductor structure may include a capacitor hole. Optionally, a deposition material of a polycrystalline silicon layer may be silane or disilane, and may also be doped with one or more elements of boron, arsenic, phosphorus, or germanium.

Figure 3A:
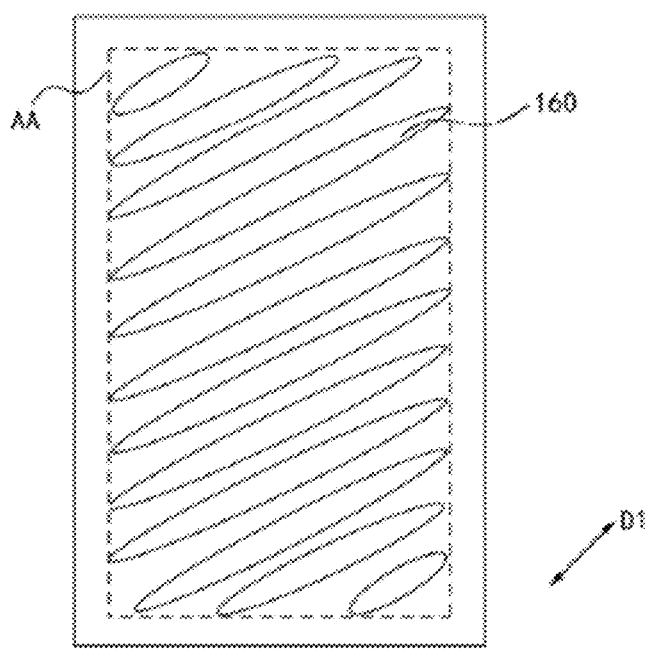
Figure 3B:
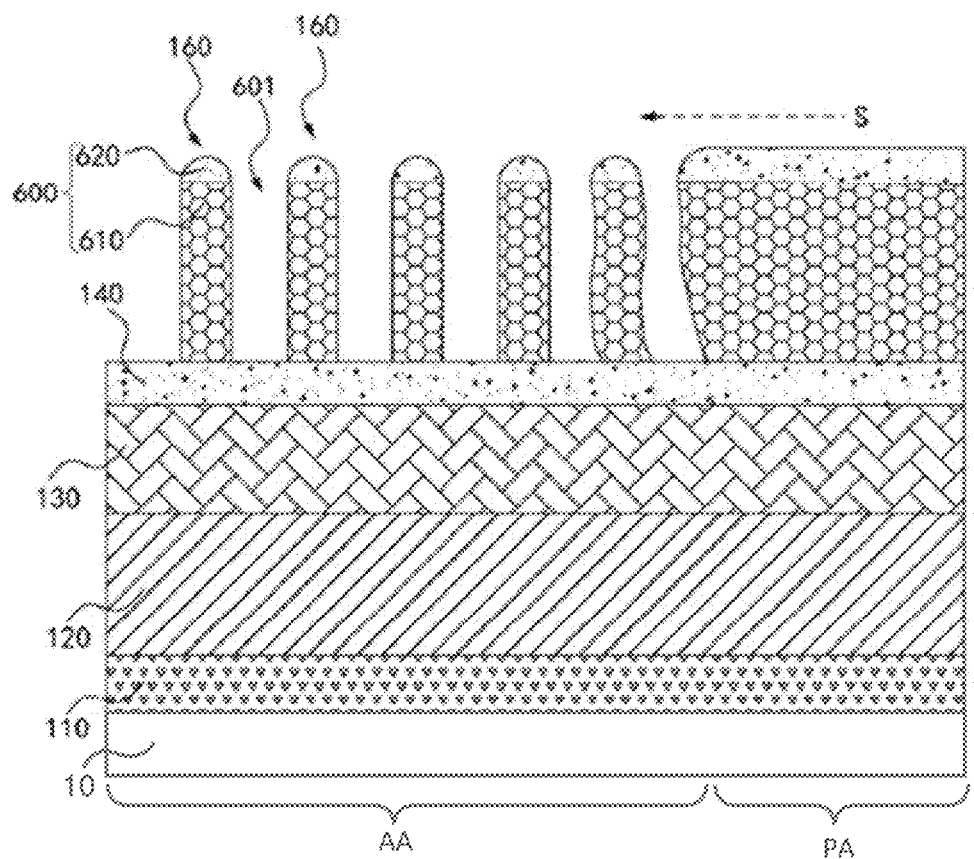

As shown in FIG. 2B, FIG. 3A, and FIG. 3B, the second laminated structure 600 includes a second dielectric layer 610 and a second mask layer 620 sequentially laminated from bottom to top. The second laminated structure 600 covers the storage regions AA and the peripheral circuit regions PA. The second laminated structure 600 located in the storage regions is patterned by using the photoresist layer 500 as a mask. Second mask strips 160 are formed in the storage regions. A top surface of the fourth material layer 140 is exposed in second gaps 601 between adjacent second mask strips 160.

Figure 4A:
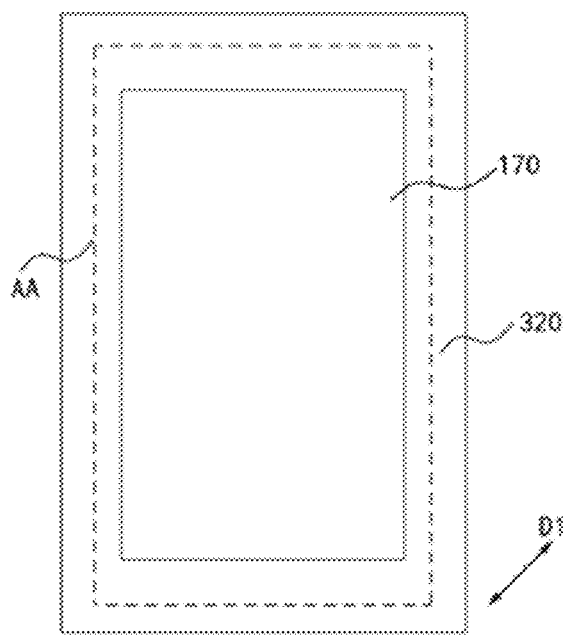
Figure 4B:
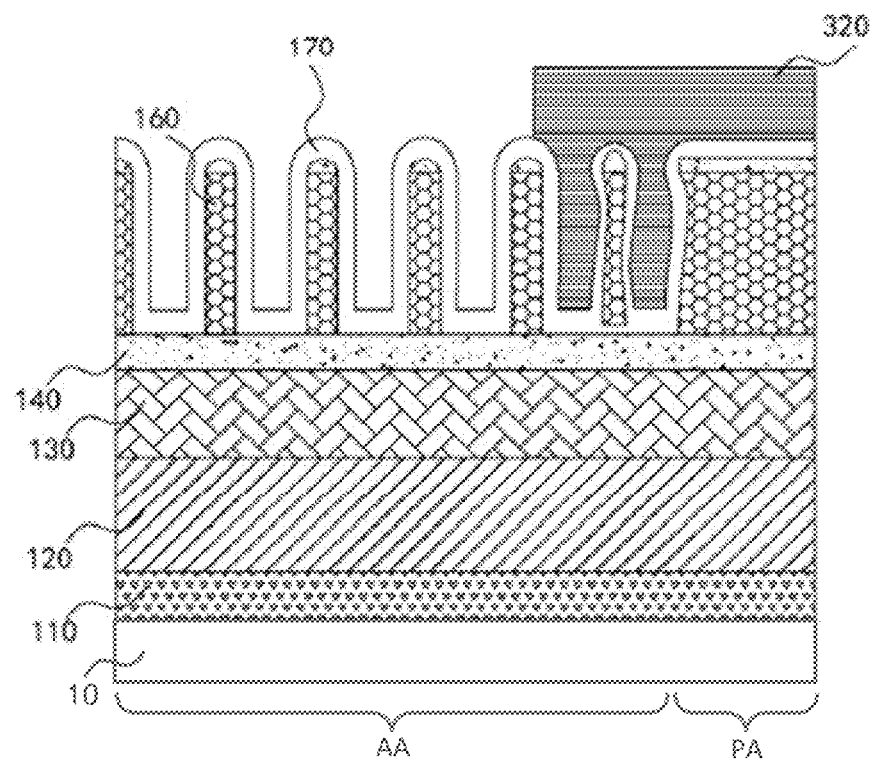

As shown in FIG. 3B, the second mask strips 160 close to the peripheral circuit regions PA have structural defects. The structural defects include but are not limited to inclination and deformation of the second mask strips 160. In the SADP process, the structures formed in the storage regions AA are array structures arranged at intervals, while the structures formed in PA are continuous filled structures. Structure density of the array structures is greater than structure density of the structures in the peripheral circuit regions PA. Consequently, an inward stress S is easily generated in the vicinity of the storage regions AA close to the peripheral circuit regions PA. In addition, a depth to width ratio of the array structures in the storage regions AA is relatively large, and the structural stability is poor, causing the second mask strips 160 to be inclined inwardly or deformed under action of the stress S, and further leading to structural defects. As shown in FIG. 4A and FIG. 4B, an isolation layer 170 is formed on the fourth material layer 140 and surfaces of the second mask strips 160, and a second buffer layer 320 is formed on an isolation layer 170 covering the second mask strips 160 that have the structural defects. That is, the second mask strips 160 that have the structural defects are covered by the second buffer layer 320. In some embodiments, the second buffer layer 320 includes a negative photoresist layer.

In some embodiments, the isolation layer 170 may be formed by using a process such as chemical vapor deposition, physical vapor deposition, or atomic layer deposition. The isolation layer 170 may uniformly cover top surfaces, side walls of the second mask strips 160, and the exposed top surface of the fourth material layer 140. A material of the isolation layer 170 may include silicon oxide.

Figure 5A:
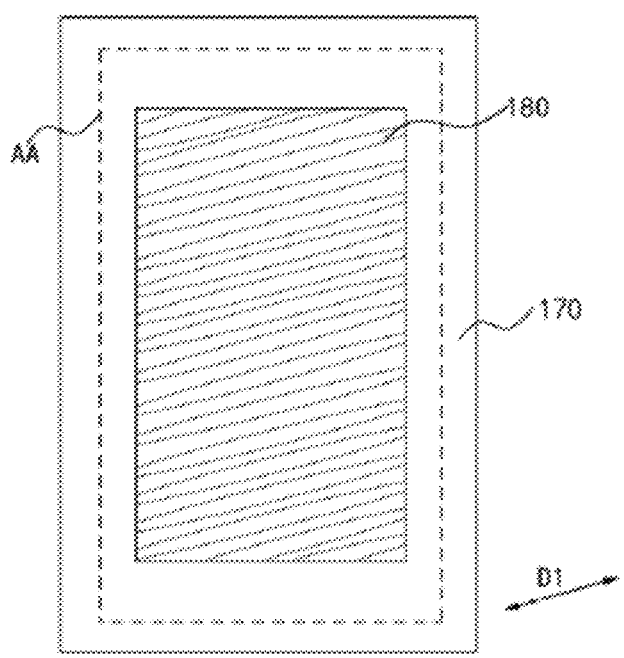
Figure 5B:
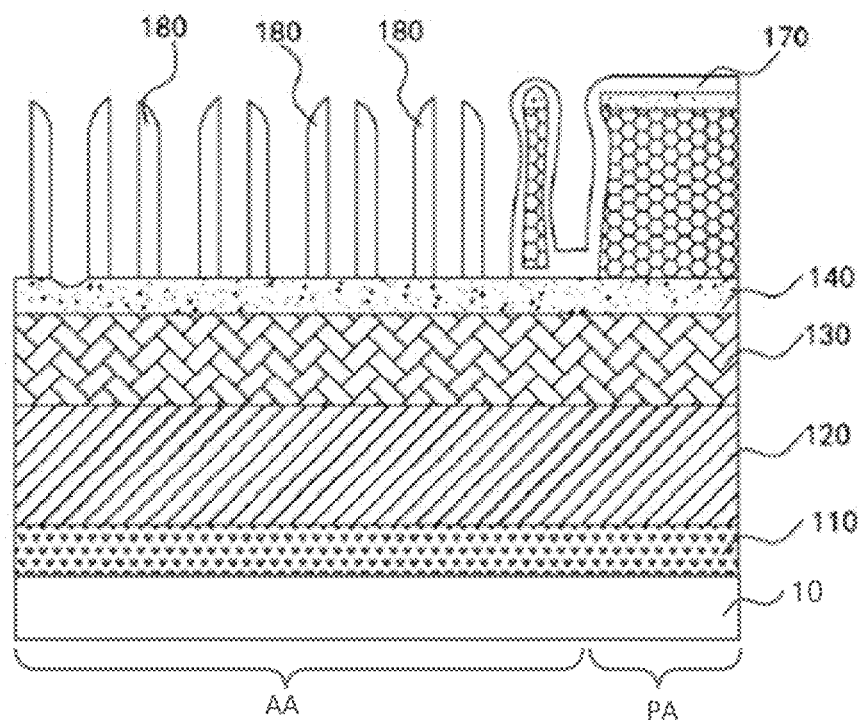

As shown in FIG. 5A and FIG. 5B, an etching process is performed on the isolation layer 170 to form a plurality of first hard masks 180. The plurality of first hard masks 180 are spaced apart from each other. For example, the etching process may be anisotropic etching.

In the process steps shown in FIG. 4A and FIG. 4B, because the second mask strips 160 that have the structural defects have been covered by the second buffer layer 320, during the etching process performed on the isolation layer 170, only second mask strips 160 without structural defects are etched, and then a plurality of first hard masks 180 with accurate and complete structures are obtained.

After the plurality of first hard masks 180 are formed by etching the isolation layer 170, the method further includes: removing the second buffer layer 320.

In the removing the second buffer layer 320, the second buffer layer 320 may be removed by using a high temperature process.

Figure 6A:
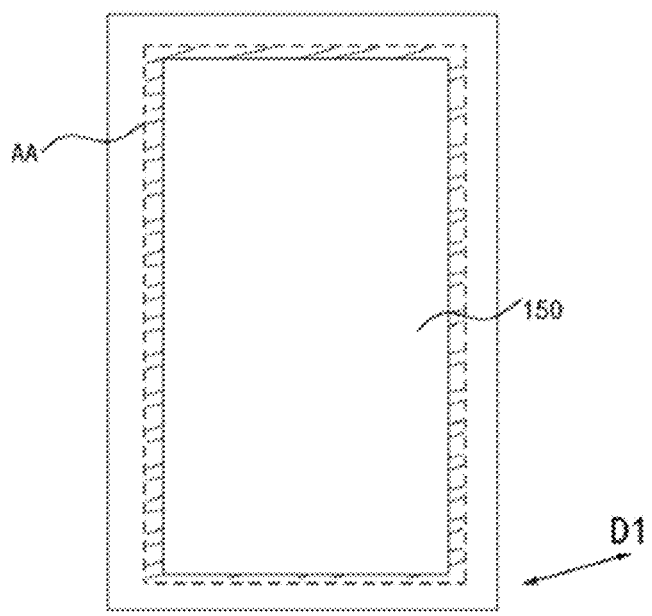
Figure 6B:
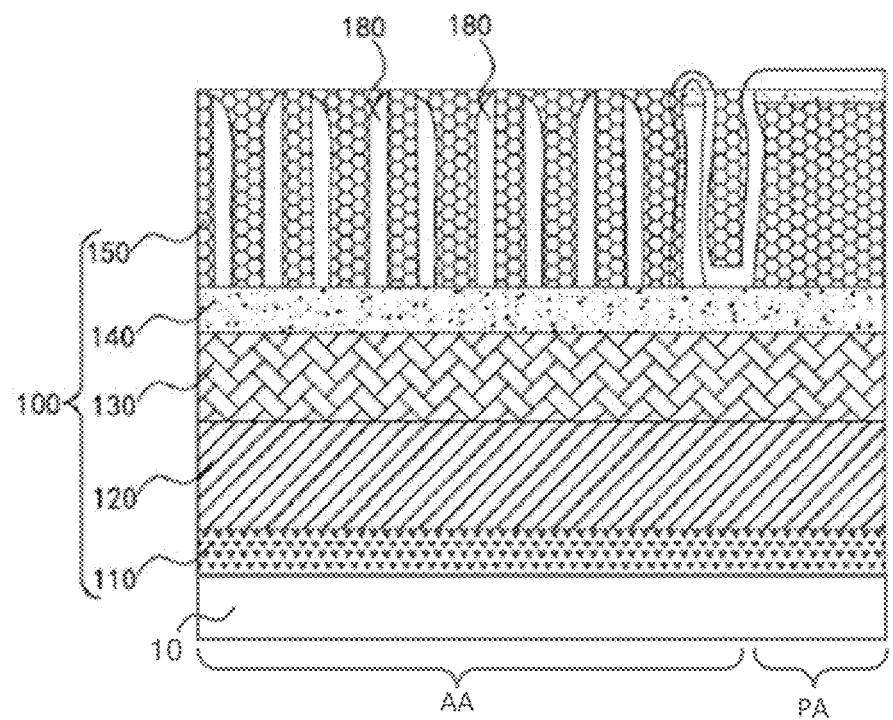

As shown in FIGS. 6A and 6B, a sacrificial layer 150 is formed on the fourth material layer 140. The sacrificial layer 150 fills at least gaps between adjacent first hard masks 180. A material of the sacrificial layer 150 includes but is not limited to silicon oxide or silicon oxynitride.

It should be noted that, the pattern transfer layer 100 of the present disclosure may include the first material layer 110, the second material layer 120, the third material layer 130, the fourth material layer 140, and the sacrificial layer 150 sequentially laminated from bottom to top.

Figure 6C:
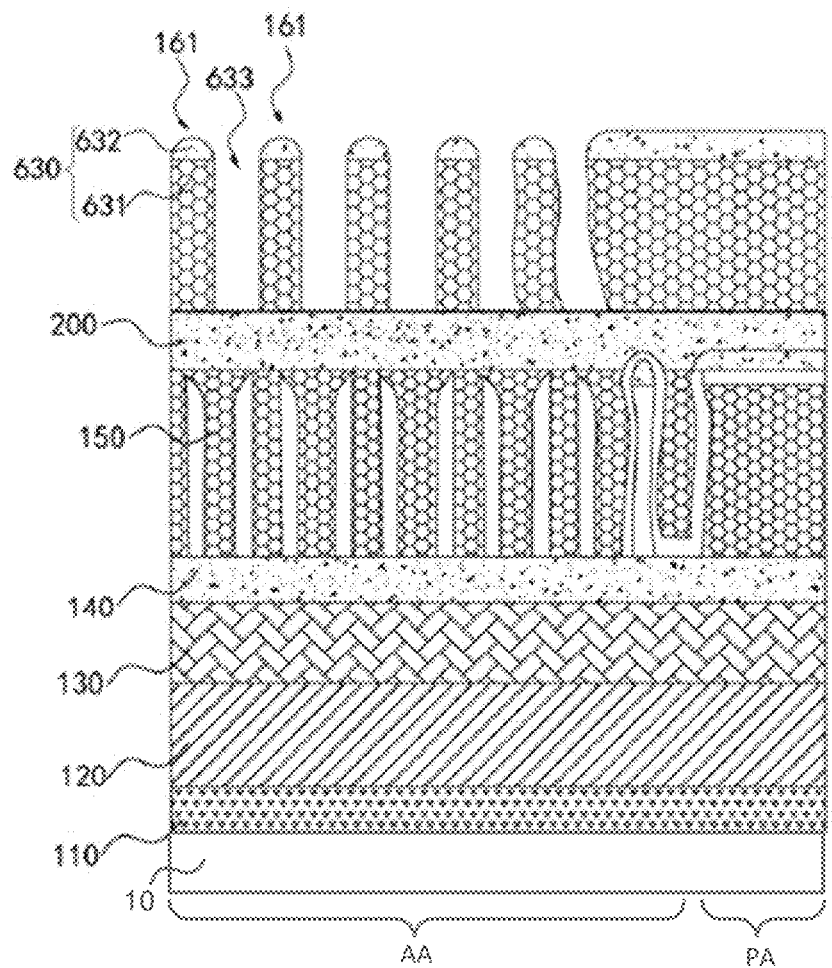

As shown in FIG. 6C, a barrier layer 200 is formed on the sacrificial layer 150. Optionally, the barrier layer 200 and the fourth material layer 140 are made of a same material, including but not limited to silicon oxynitride.

Figure 7A:
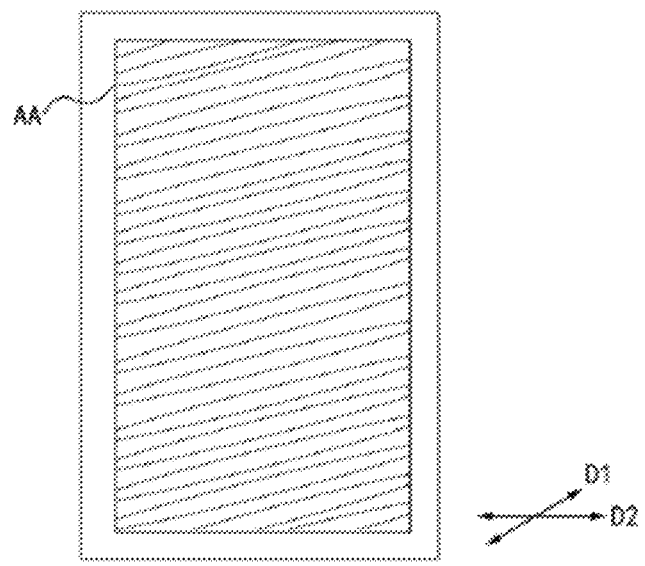
Figure 7B:
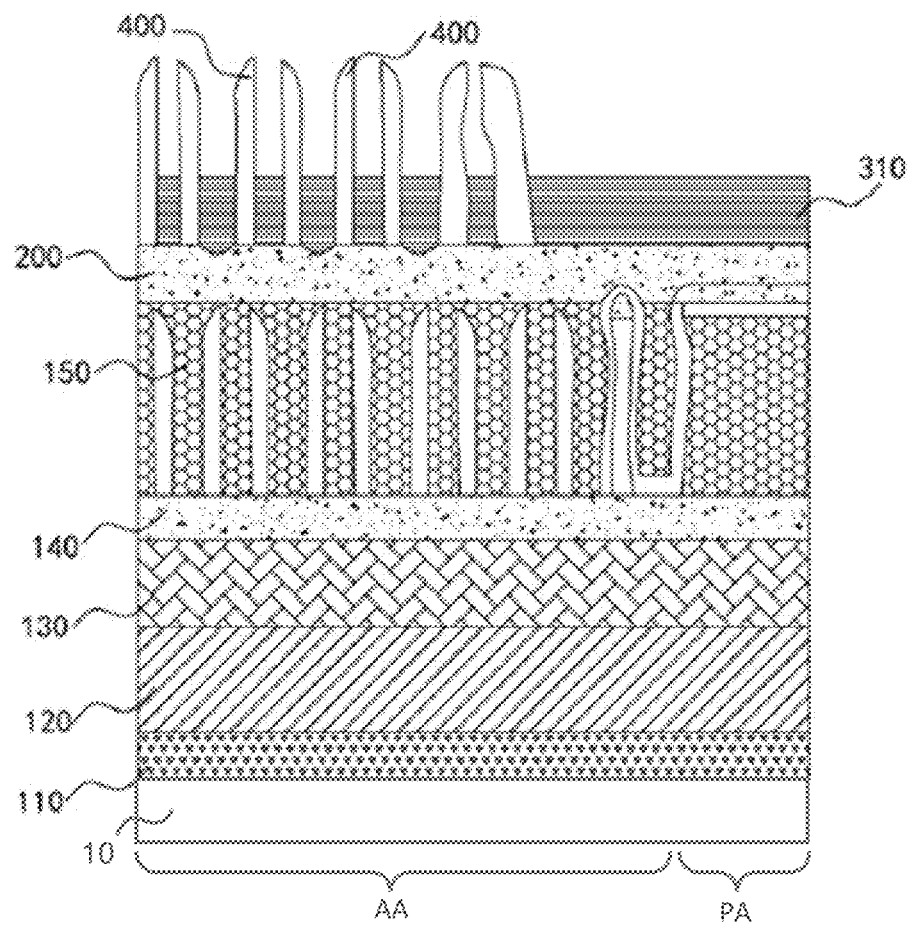

Subsequently, a plurality of second hard masks 400 extending along a second direction D2 are formed on the barrier layer 200 (as shown in FIG. 7B). The second hard masks 400 are spaced apart from each other. The forming a plurality of second hard masks 400 on the barrier layer 200 may be similar to the forming a plurality of first hard masks 180. Specifically:

as shown in FIG. 6C, first, a plurality of first mask strips 161 are formed on the barrier layer 200, which specifically includes: forming, on the barrier layer 200, a first laminated structure 630 including a first dielectric layer 631 and a first mask layer 632 sequentially laminated from bottom to top, wherein the first laminated structure 630 covers the barrier layer 200; and patterning the first laminated structure 630 located on the barrier layer 200, and forming the plurality of first mask strips 161 on the barrier layer 200, wherein the barrier layer 200 is exposed in first gaps 633 between adjacent first mask strips 161; and the first mask strips 161 are located in the storage regions AA and extend along the second direction D2.

Figure 6D:
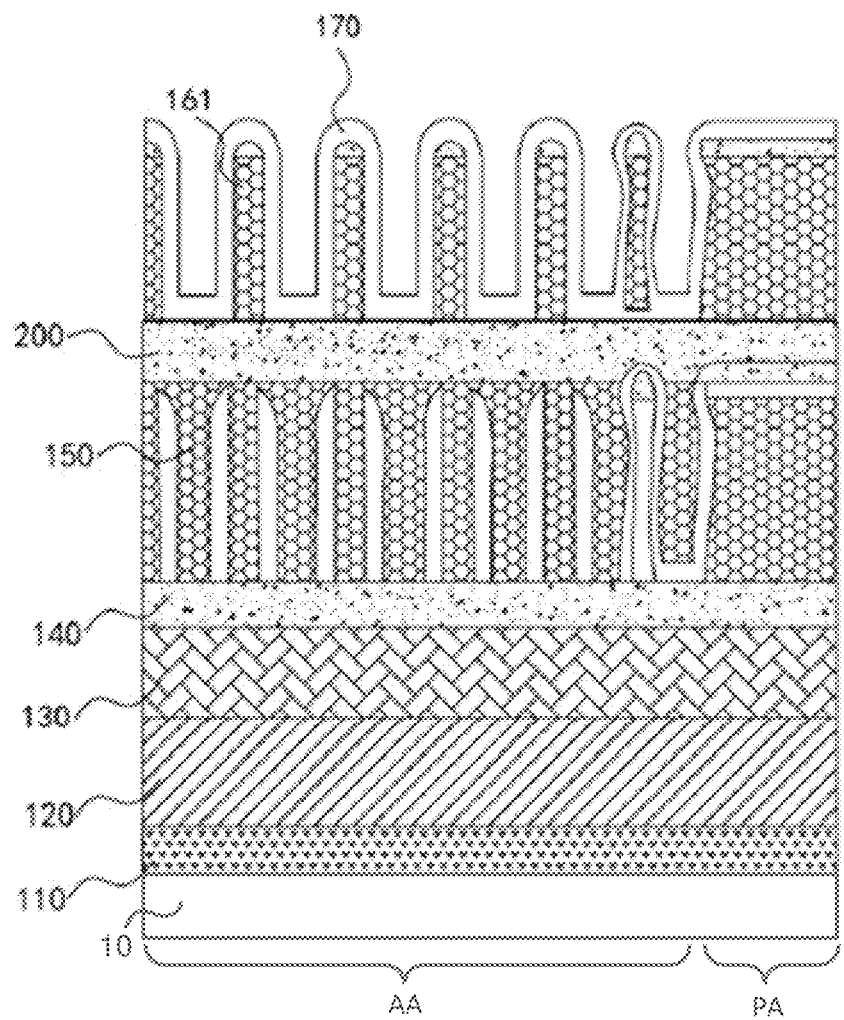

Then, as shown in FIG. 6D, an isolation layer 170 is formed on the barrier layer 200 and surfaces of the first mask strips. The isolation layer 170 is formed by using a process including but not limited to chemical vapor deposition, physical vapor deposition, or atomic layer deposition. The isolation layer 170 may uniformly cover top surfaces and side walls of the first mask strips 161 and the exposed barrier layer 200. A material of the isolation layer 170 may include silicon oxide.

Finally, as shown in FIG. 7B, the isolation layer 170 is etched to form a plurality of second hard masks 400 on the barrier layer 200.

In an implementation, the first direction D1 intersects the second direction D2. Preferably, an angle between the first direction D1 and the second direction D2 is 40° to 70°.

Referring to FIG. 7A and FIG. 7B, a first buffer layer 310 is formed on a surface of the barrier layer 200 and in gaps between adjacent second hard masks 400.

In an exemplary implementation, the first buffer layer 310 may include a negative photoresist layer.

As shown in FIG. 7B, the second hard masks 400 are located in the storage regions and second hard masks close to the peripheral circuit regions have structural defects.

Figure 8A:
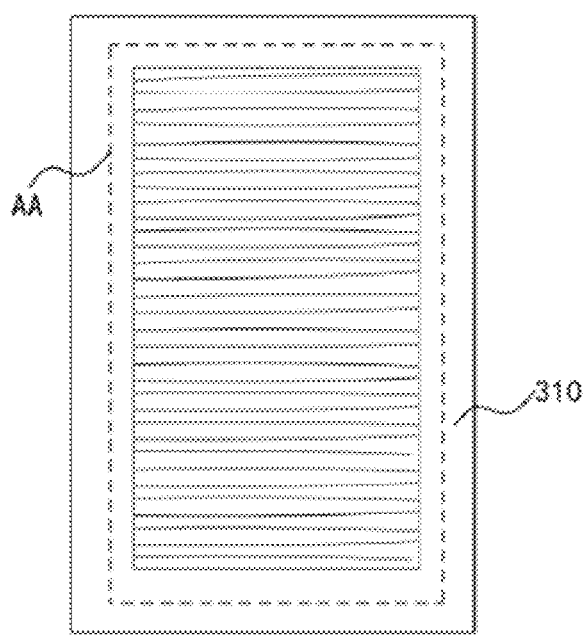
Figure 8B:
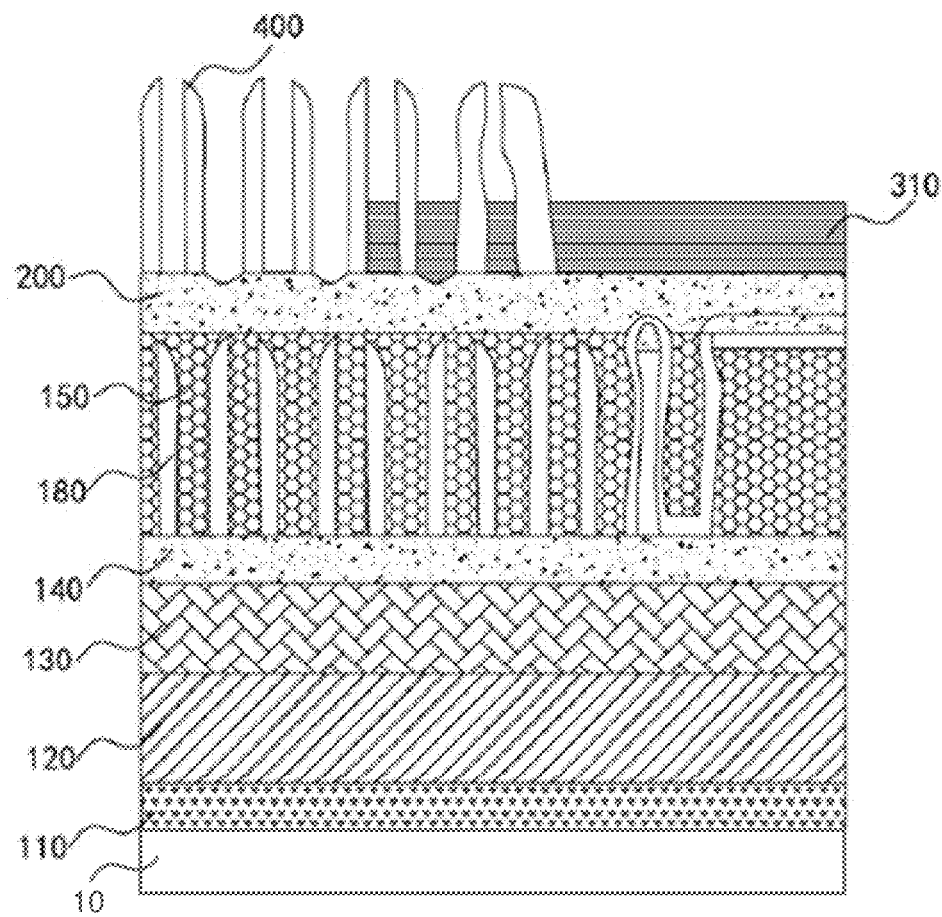

As shown in FIG. 8A and FIG. 8B, after the first buffer layer 310 is formed, a part of the first buffer layer 310 is removed to expose second hard masks 400 that do not have the structural defects.

Figure 9A:
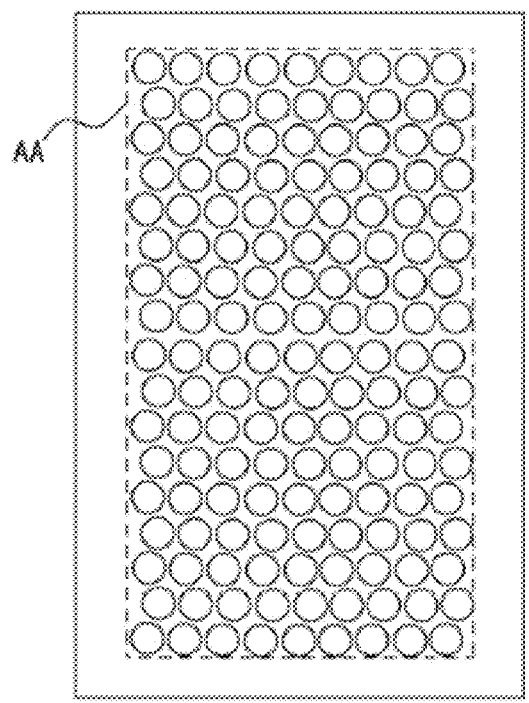
Figure 9B:
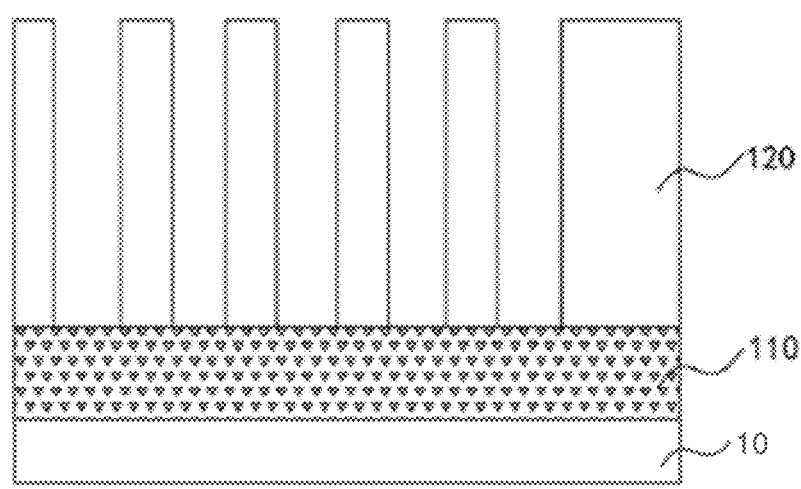

As shown in FIG. 9A and FIG. 9B, after the second hard masks 400 that do not have the structural defects are exposed, the barrier layer 200 and the pattern transfer layer 100 are patterned by using the first buffer layer 310 and second hard masks 400 not filled with the first buffer layer 310 as a mask.

Because the second hard masks 400 that have the structural defects are covered by the first buffer layer 310, an accurate and complete structure can be obtained after the barrier layer 200 and the pattern transfer layer 100 are patterned by using the first buffer layer 310 and the second hard masks 400 that do not have the structural defects as a mask. The structure after the patterning may be used as a mask for forming the semiconductor structure, for example, used as a mask for forming a capacitor hole.

In an implementation, the patterning the barrier layer 200 and the pattern transfer layer 100 may include: patterning the first material layer 110 and the second material layer 120. The first material layer 110 may include a polycrystalline silicon layer, and the second material layer 120 may include a silicon oxide layer. The second material layer 120 may be used as a mask of the first material layer 110. An etching selection ratio of silicon oxide to polycrystalline silicon is relatively high, and polycrystalline silicon is harder and has better structural stability. Therefore, use of a polycrystalline silicon material as a mask for a patterning process can ensure integrity of a semiconductor structure. The semiconductor structure may include a capacitor hole.

In an implementation, the third material layer 130 may include an amorphous carbon layer. The third material layer 130 may be used as the sacrificial layer, to ensure that the surface of the second material layer 120 is flush during the etching of the second material layer 120.

The present disclosure further provides a semiconductor structure, manufactured by using the patterning method in any one of the foregoing embodiments.

Based on the above, the patterning method and the semiconductor structure of the embodiments of the present disclosure have the following advantages and beneficial effects:

According to the patterning method of the embodiments of the present disclosure, the plurality of second hard masks 400 are formed on the barrier layer 200, the first buffer layer 310 is formed on the second hard masks 400, and the barrier layer 200 and the pattern transfer layer 100 are patterned by using the first buffer layer 310 and the second hard masks 400 that are not filled with the first buffer layer 310 as a mask. The orthographic projection of the first buffer layer 310 overlaps the peripheral circuit regions and a part of each of the storage regions, and the second hard masks 400 are located in the storage regions and second hard masks 400 that have the structural defects and that are close to the peripheral circuit regions are filled with the first buffer layer 310. Therefore, a problem of causing structural defects in the storage regions at locations close to the peripheral circuit regions after the patterning process is performed by using the second hard masks 400 that have the structural defects can be effectively avoided, such that a pattern feature structure is accurately transferred, thereby helping improve accuracy of the patterning process, and ensuring accuracy of a formed semiconductor structure.

In addition, the second mask strips 160 that have the structural defects are covered by the second buffer layer 320, such that only the second mask strips 160 without structural defects are etched during the etching of the isolation layer 170, thereby ensuring structural accuracy and integrity of the first hard masks 180. In the process of patterning the barrier layer 200 and the pattern transfer layer 100 by using the first buffer layer 310 and the second hard masks 400 that are not filled with the first buffer layer as a mask, the structural integrity and high accuracy of the first hard masks 180 further ensure accuracy of pattern transfer, thereby reducing an etching load effect in a subsequent pattern transfer process.

In the disclosed embodiments, the terms "first", "second", and "third" are used only for descriptive purposes, and should not be understood as indicating or implying relative importance; and the term "a plurality of" refers to two or more, unless otherwise specifically defined. The terms such as "mounted to", "connected with", "connected to", or "fixed to" should be comprehended in a broad sense. For example, "connected to" may be comprehended as being fixedly connected, detachably connected, or integrally connected; "connected with" may be directly connected or indirectly connected through an intermediary. Those of ordinary skill in the art may understand specific meanings of the foregoing terms in the disclosed embodiments according to specific circumstances.

It should be understood that in the description of the disclosed embodiments, the terms such as "top", "bottom", "left", "right", "front" and "rear" indicate the orientation or position relationships based on the drawings. These terms are merely intended to facilitate description of the disclosed embodiments and simplify the description, rather than to indicate or imply that the mentioned device or element must have a specific direction and must be constructed and operated in a specific orientation. Therefore, these terms should not be construed as a limitation to the disclosed embodiments.

In the description of this specification, the description with reference to the terms such as "one embodiment", "some embodiments", and "a specific embodiment" means that the specific features, structures, materials, or characteristics described with reference to the embodiment or example are included in at least one embodiment or example of the disclosed embodiments. In this specification, the schematic expression of the above terms does not necessarily refer to the same embodiment or example. Furthermore, the specific features, structures, materials, or characteristics described may be combined in a suitable manner in any one or more of embodiments or examples.

The above are only preferred embodiments of the disclosed embodiments, and are not used to limit the disclosed embodiments. For those skilled in the art, the disclosed embodiments may have various modifications and changes. Any modification, equivalent replacement, improvement, or the like made within the spirit and principle of the disclosed embodiments shall fall within the protection scope of the disclosed embodiments.

The invention claimed is:

1. A patterning method, comprising:
   providing a substrate, wherein the substrate comprises adjacent storage regions and peripheral circuit regions;
   forming, on the substrate, a pattern transfer layer, the pattern transfer layer having a plurality of first hard masks, wherein the first hard masks extend along a first direction and are spaced apart from each other; and forming a barrier layer on the pattern transfer layer;
   forming, on the barrier layer, a plurality of second hard masks, the plurality of second hard masks extending along a second direction, wherein the second hard masks are spaced apart from each other; and
   the second hard masks are located in the storage regions and second hard masks close to the peripheral circuit regions have structural defects;
   forming a first buffer layer on the barrier layer, and filling the second hard masks that have the structural defects with the first buffer layer, wherein an orthographic projection of the first buffer layer overlaps the peripheral circuit regions and a part of each of the storage regions; and
   patterning the barrier layer and the pattern transfer layer by using the first buffer layer and second hard masks not filled with the first buffer layer as a mask.

2. The patterning method according to claim 1, wherein the filling the second hard masks that have the structural defects with the first buffer layer comprises:
   adding the first buffer layer onto the barrier layer and between adjacent second hard masks; and
   removing a part of the first buffer layer to expose a part of the second hard masks that do not have the structural defects.

3. The patterning method according to claim 1, wherein the first buffer layer comprises a negative photoresist layer.

4. The patterning method according to claim 1, wherein the forming, on the barrier layer, the plurality of second hard masks, the plurality of second hard masks extending along the second direction comprises:
   forming a plurality of first mask strips on the barrier layer, wherein the first mask strips extend along the second direction and are spaced apart from each other;
   forming an isolation layer on a surface of each of the first mask strips and the barrier layer; and
   performing an etching process on the isolation layer to form the plurality of second hard masks.

5. The patterning method according to claim 4, wherein the forming the plurality of first mask strips on the barrier layer comprises:
   forming, on the barrier layer, a first laminated structure, the first laminated structure comprising a first dielectric layer and a first mask layer sequentially laminated from bottom to top, wherein the first laminated structure covers the barrier layer; and
   patterning the first laminated structure located on the barrier layer, and forming the plurality of first mask strips on the barrier layer, wherein a top surface of the barrier layer is exposed in gaps between adjacent first mask strips; and
   the first mask strips are located in the storage regions.

6. The patterning method according to claim 1, wherein the forming, on the substrate, the pattern transfer layer, the pattern transfer layer having the plurality of first hard masks comprises:
   sequentially depositing a first material layer, a second material layer, a third material layer, and a fourth material layer on the substrate from bottom to top;
   forming, on the fourth material layer, a plurality of second mask strips, the plurality of second mask strips extending along the first direction;
   forming an isolation layer on the fourth material layer and a surface of each of the second mask strips;
   forming a second buffer layer on the isolation layer, wherein the second buffer layer covers the second mask strips that have the structural defects; and
   performing an etching process on the isolation layer to form the plurality of first hard masks.

7. The patterning method according to claim 6, wherein the forming, on the fourth material layer, a plurality of second mask strips, the plurality of second mask strips extending along the first direction comprises:
   forming, on the fourth material layer, a second laminated structure, the second laminated structure comprising a second dielectric layer and a second mask layer sequentially laminated from bottom to top, wherein the second laminated structure covers the storage regions and the peripheral circuit regions; and
   patterning the second laminated structure located in the storage regions, and forming the plurality of second mask strips on the fourth material layer, wherein a top surface of the fourth material layer is exposed in gaps between adjacent second mask strips.

8. The patterning method according to claim 6, wherein after the plurality of first hard masks are formed, the method further comprises:
   removing the second buffer layer.

9. The patterning method according to claim 6, wherein after the plurality of first hard masks are formed, the method further comprises:
   forming a sacrificial layer on the fourth material layer, wherein the sacrificial layer fills at least gaps between adjacent first hard masks, and
   the barrier layer is formed on the sacrificial layer.

10. The patterning method according to claim 6, wherein the fourth material layer and the barrier layer are made of a same material and both comprise silicon oxynitride.

11. The patterning method according to claim 6, wherein the patterning the barrier layer and the pattern transfer layer comprises:
    patterning the first material layer and the second material layer.

12. The patterning method according to claim 11, wherein the etching process is performed by using a patterned first material layer and a patterned second material layer as a mask, to form a semiconductor structure.

13. The patterning method according to claim 1, wherein the first direction intersects the second direction.

14. The patterning method according to claim 13, wherein an angle between the first direction and the second direction is 40° to 70°.

15. A semiconductor structure, manufactured by using the patterning method according to claim 1.

* * * * *